(12) United States Patent
Muraki et al.

(10) Patent No.: US 9,583,311 B2
(45) Date of Patent: Feb. 28, 2017

(54) DRAWING APPARATUS, LITHOGRAPHY SYSTEM, PATTERN DATA CREATION METHOD, DRAWING METHOD, AND METHOD OF MANUFACTURING ARTICLES

(71) Applicant: CANON KABUSHIKI KAISHA, Tokyo (JP)

(72) Inventors: Masato Muraki, Inagi (JP); Yoshihiro Hirata, Fuchu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/919,440

(22) Filed: Oct. 21, 2015

(65) Prior Publication Data

US 2016/0126062 A1    May 5, 2016

(30) Foreign Application Priority Data

Oct. 27, 2014   (JP) ................. 2014-218719

(51) Int. Cl.
| | |
|---|---|
| *G21K 5/10* | (2006.01) |
| *G21K 5/00* | (2006.01) |
| *H01J 3/14* | (2006.01) |
| *H01J 37/317* | (2006.01) |
| *H01J 37/302* | (2006.01) |

(52) U.S. Cl.
CPC ...... *H01J 37/3177* (2013.01); *H01J 37/3026* (2013.01); *H01J 2237/31762* (2013.01); *H01J 2237/31764* (2013.01)

(58) Field of Classification Search
USPC ......... 250/310, 396 R, 492.1, 492.2, 492.22, 250/492.3
See application file for complete search history.

(56) References Cited

U.S. PATENT DOCUMENTS 4,532,598 A * 7/1985 Shibayama ......... H01J 37/3026
  250/398
4,816,692 A * 3/1989 Rudert, Jr. .......... H01J 37/3026
  250/492.2

(Continued)

FOREIGN PATENT DOCUMENTS

JP    2004-172428 A    6/2004
JP    2006-019434 A    1/2006

*Primary Examiner* — Bernard Souw
(74) *Attorney, Agent, or Firm* — Canon USA, Inc. I.P. Division

(57) ABSTRACT

At least one drawing apparatus according to an exemplary embodiment includes a plurality of optical systems and repeats an operation to draw a pattern on a substrate while partly overlapping stripe-shaped regions drawn by the optical systems. The drawing apparatus includes a creation unit configured to create data to be supplied to each of the plurality of optical systems by using a plurality of sub pattern data, each of the plurality of sub pattern data serving as unit data of pattern data used by the plurality of optical systems, corresponding to a region having a width obtainable by dividing the stripe-shaped regions in a drawing width direction, and including information relating to continuity of drawing instruction data and exposure amount information. The creation unit is configured to create the data by changing exposure amount information corresponding to an overlapping drawing region based on the information relating to the continuity.

10 Claims, 9 Drawing Sheets

(56) References Cited

U.S. PATENT DOCUMENTS

| | | | | |
|---|---|---|---|---|
| 4,853,870 A | * | 8/1989 | Yasutake | B82Y 10/00 250/396 R |
| 4,870,286 A | * | 9/1989 | Tobuse | H01J 37/3023 250/398 |
| 2001/0017355 A1 | * | 8/2001 | Mizuno | H01J 37/3026 250/492.22 |
| 2006/0169926 A1 | * | 8/2006 | Mizuno | H01J 37/3026 250/492.22 |
| 2009/0187878 A1 | * | 7/2009 | Ogino | B82Y 10/00 716/55 |
| 2016/0118221 A1 | * | 4/2016 | Muraki | H01J 37/3174 250/492.3 |
| 2016/0126062 A1 | | 5/2016 | Muraki et al. | |

\* cited by examiner

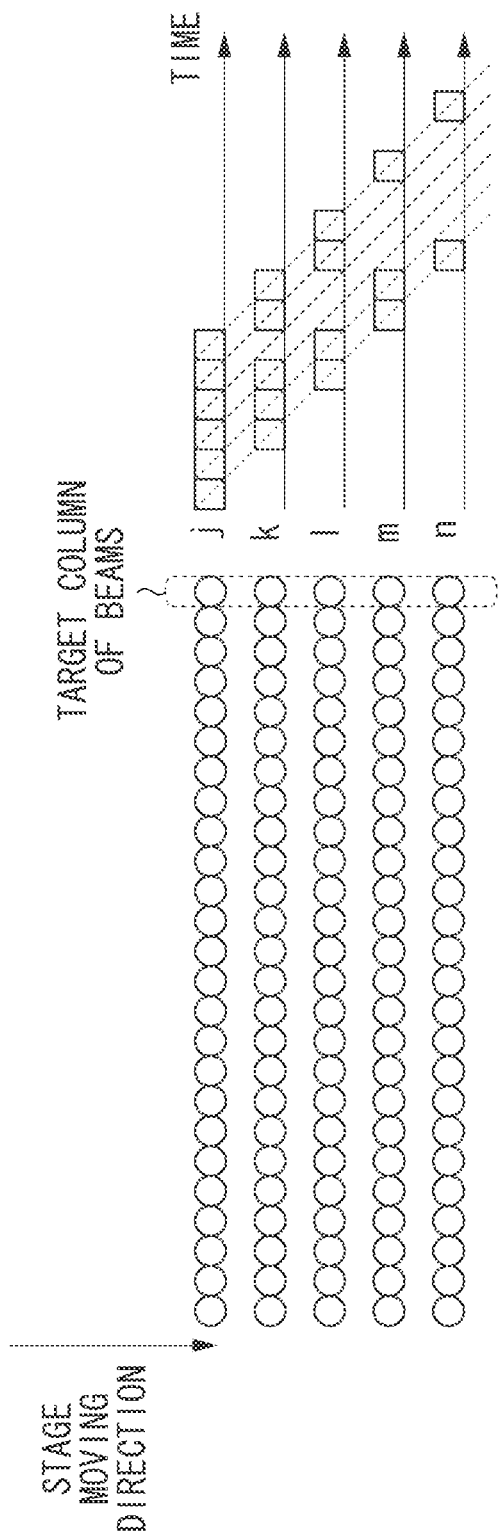
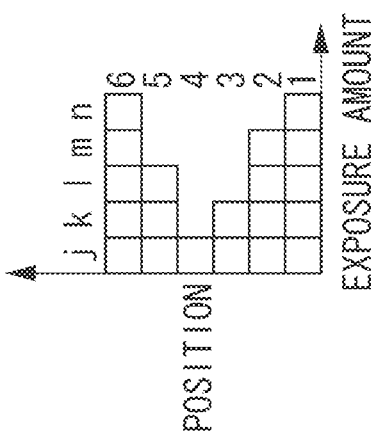

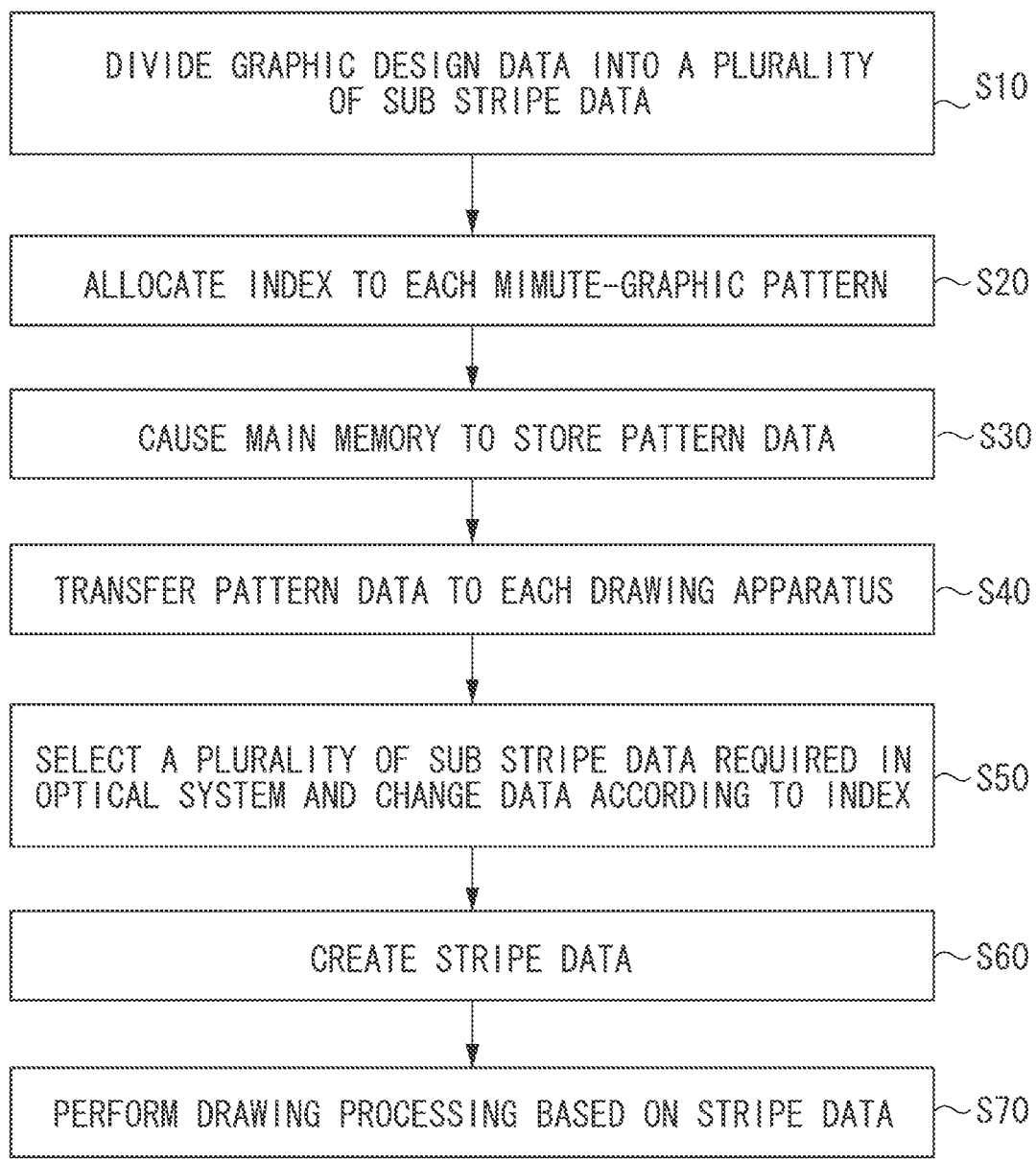

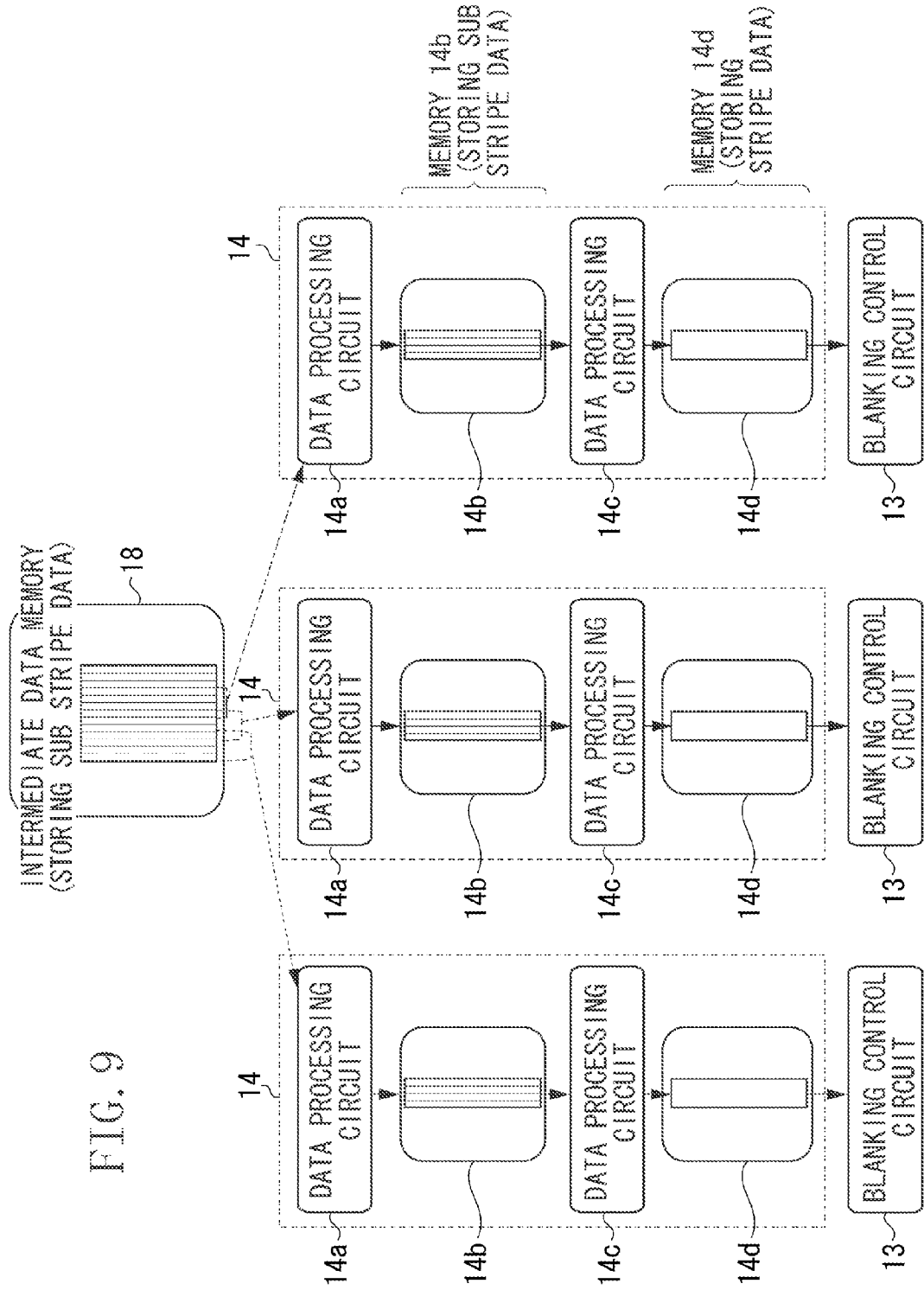

DRAWING APPARATUS, LITHOGRAPHY SYSTEM, PATTERN DATA CREATION METHOD, DRAWING METHOD, AND METHOD OF MANUFACTURING ARTICLES

BACKGROUND OF THE INVENTION

Field of the Invention

The present disclosure relates to a drawing apparatus, a lithography system, a pattern data creation method, a drawing method, and a method of manufacturing articles.

Description of the Related Art

There is a conventional drawing apparatus that includes a plurality of electronic optical systems (hereinafter, simply referred to as "optical systems") capable of emitting a plurality of electron beams to draw a pattern on a substrate. For example, in a case where the optical systems are arrayed in a row on a horizontal surface, each optical system can draw a pattern in each stripe-shaped region having a long side extending in a direction perpendicular to the array direction.

According to the above-mentioned drawing method, a plurality of optical systems can simultaneously draw patterns in different shot regions. Of course, drawing operations by the different optical systems can be performed in the same shot region at different timings. However, if the substrate causes a deformation due to thermal influence, a pattern straddling a border between two neighboring regions drawn at different timings may be split. The yield rate will decrease in the manufacturing of semiconductor elements.

As discussed in Japanese Patent Application Laid-Open No. 2006-19434, it is conventionally known that a drawing apparatus can perform overlapping drawing in such a way as to prevent a pattern from being split when deflection accuracy is insufficient. The overlapping drawing is characterized by partly overlapping regions drawn with two neighboring beams of a plurality of beams emitted from one optical system. In this case, the drawing apparatus does not perform the overlapping drawing to draw a pattern in a region to be drawn with only one of two beams and performs the overlapping drawing to draw a pattern in a region to be drawn with two beams.

When a plurality of optical systems is provided in a drawing apparatus, drawing operations by all optical systems are not always performed at the same place on different chips. Therefore, the drawing apparatus needs to perform processing for dividing graphic design data corresponding to a drawing pattern (e.g., a circuit pattern) in such a way as to match a stripe-shaped region to be drawn by each optical system and converting the divided data into pattern data. More specifically, it is necessary for the drawing apparatus to include a conversion processing circuit capable of performing division processing suitable for each optical system and converting the divided data into pattern data and a memory capable of storing the converted data.

The data conversion processing is a work requiring a relatively long time to process massive data. Therefore, in a case where a drawing apparatus including a plurality of optical systems performs overlapping drawing, the drawing apparatus would not to perform the drawing according to the drawing method discussed in Japanese Patent Application Laid-Open No. 2006-19434. The data processing time and the data amount may increase according to the number of the optical systems.

SUMMARY OF THE INVENTION

Exemplary embodiments of the present disclosure intend to provide at least one drawing apparatus that includes a plurality of optical systems and repeats an operation to draw a pattern on a substrate while partly overlapping stripe-shaped regions drawn by the optical systems. The at least one drawing apparatus includes a creation unit configured to create data to be supplied to each of the plurality of optical systems by using a plurality of sub pattern data, each of the plurality of sub pattern data serving as unit data of pattern data used by the plurality of optical systems, corresponding to a region having a width obtainable by dividing the stripe-shaped regions in a drawing width direction, and including information relating to continuity of drawing instruction data and exposure amount information. The creation unit is configured to create the data by changing exposure amount information corresponding to an overlapping drawing region based on the information relating to the continuity.

According to other aspects of the present disclosure, one or more additional drawing apparatuses, one or more lithography systems, one or more pattern creation methods, one or more drawing methods, and one or more methods of manufacturing articles are discussed herein. Further features of the present disclosure will become apparent from the following description of exemplary embodiments with reference to the attached drawings.

BRIEF DESCRIPTION OF THE DRAWINGS

FIGS. 5A, 5B, and 5C illustrate a drawing method.

FIG. 6 is a flowchart illustrating a data creation method and a drawing method.

FIG. 9 illustrates data conversion.

DESCRIPTION OF THE EMBODIMENTS

Figure 1:
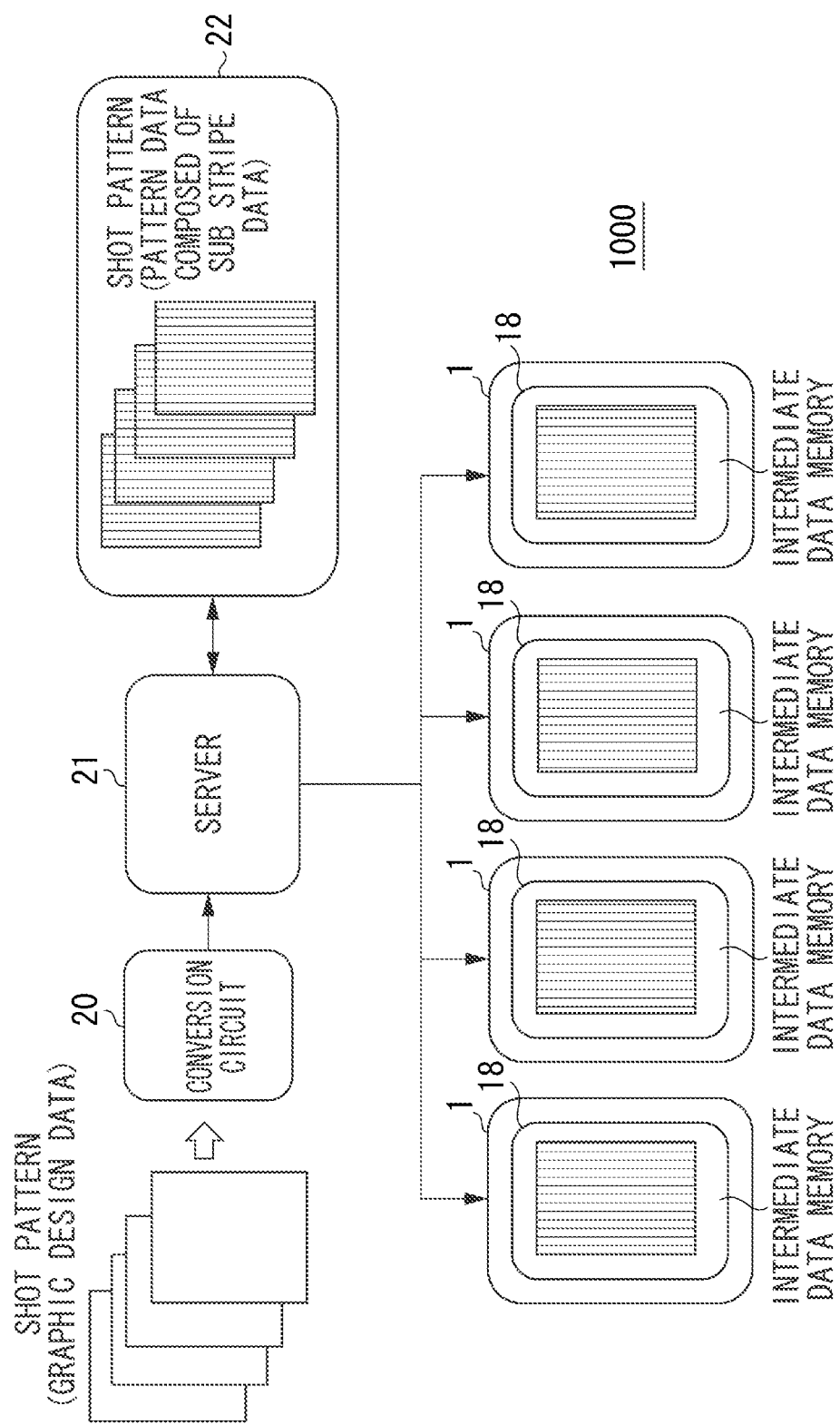
FIG. 1 is a configuration diagram illustrating a lithography system.

FIG. 1 is a configuration diagram illustrating a lithography system 1000 according to a first exemplary embodiment and a second exemplary embodiment. The lithography system 1000 includes four electron beam drawing apparatus 1 (hereinafter, simply referred to as "drawing apparatus 1").

The lithography system 1000 includes a conversion circuit 20 that can convert shot pattern (drawing pattern) related graphic design data into pattern data and a main memory (i.e., a storage unit) 22 that can store the converted pattern data. The main memory 22 stores a plurality of types of pattern data.

Further, the lithography system 1000 includes a server 21. The server 21 is capable of causing the main memory 22 to store the converted pattern data. Further, the server 21 can select appropriate shot pattern related pattern data from the main memory 22 and can transfer the selected pattern data to an intermediate data memory 18 (hereinafter, simply referred to as "intermediate memory 18") of each drawing apparatus 1.

In the present exemplary embodiment, the shot pattern is a pattern formation unit relating to a single chip pattern or a plurality of chip patterns. It is desired that the size of the shot pattern and a processing unit of other lithography apparatus or processing apparatus are mutually in common.

For example the width of the shot pattern in a shorter direction is appropriately 20 mm to 25 mm.

The graphic design data is, for example, vector format data. Further, the pattern data is, for example, bitmap format image data. The pattern data is chip pattern related data or shot pattern data, which is minimum repetition unit data of a plurality of patterns to be formed on a substrate. In the present exemplary embodiment, unit data of the pattern data is sub stripe data (i.e., sub pattern data) described below. In other words, the pattern data is a set of data including a plurality of sub stripe data. The conversion circuit 20 can perform data conversion and data transfer processing according to methods described in detail below.

Figure 2:
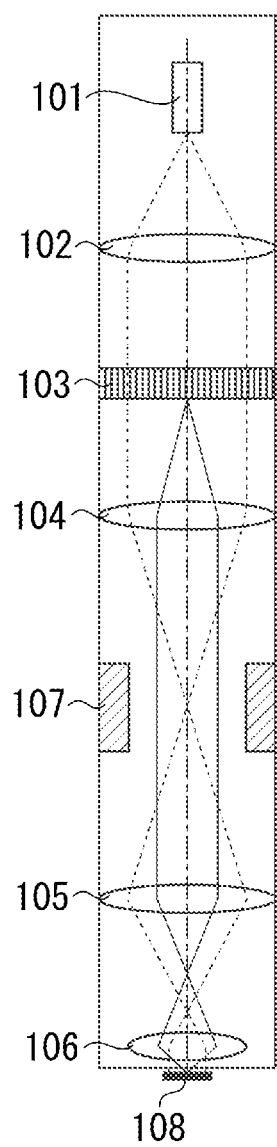
FIG. 2 is a configuration diagram illustrating an optical system.

FIG. 2 illustrates a configuration of an optical system 100 provided in each drawing apparatus 1. An electron source 101, which is capable of emitting electron beams, is a thermionic-type electron source that includes an electron emission material (e.g., $LaB_6$ or BaO/W). A collimator lens 102 is an electrostatic-type lens, which is capable of converging electron beams under application of an electric field. When the collimator lens 102 receives the electron beams emitted from the electron source 101, the collimator lens 102 shapes the received electron beams into parallel beams.

A blanking aperture array 103 can split an electron beam having passed through the collimator lens 101 into a plurality of electron beams with two-dimensionally arranged apertures (not illustrated). Further, the blanking aperture array 103 includes electrostatic-type blankers (not illustrated) that can individually deflect the plurality of electron beams having been split by the apertures according to an instruction from a blanking control circuit 13 described below. Through the above-mentioned deflecting operation, irradiation and non-irradiation of a drawing region 108 of the optical system 100 with the electron beam can be controlled.

A lens 104 is an electrostatic-type electron lens. A lens 105 is an electromagnetic-type electron lens. The lens 104 and the lens 105 can form intermediate images of the electron beams at the plurality of apertures of the blanking aperture array 103.

A lens 106 is an electromagnetic-type electron lens. The lens 106 is functionally operable as an objective lens in the optical system 100. The lens 106 can project intermediate images formed by the lens 104 and the lens 105 on the drawing region 108. A deflector 107 can deflect the plurality of electron beams in a batch fashion in a predetermined direction and can precisely adjust the position of the drawing region 108 in relation to a wafer (substrate) 10 illustrated in FIG. 3.

Figure 3:
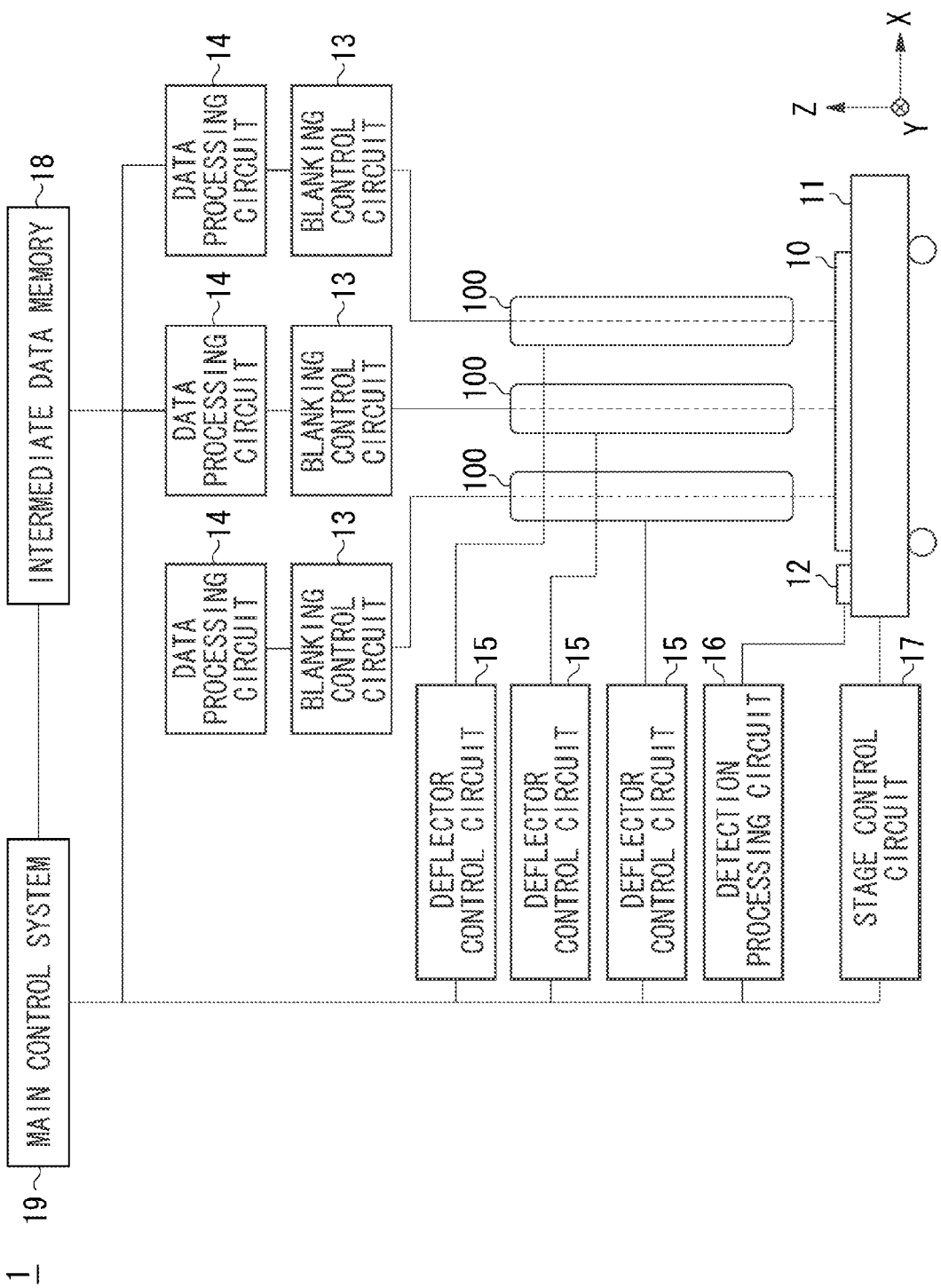
FIG. 3 is a configuration diagram illustrating a drawing apparatus.

FIG. 3 illustrates a configuration of each drawing apparatus 1. Each drawing apparatus 1 includes three optical systems 100. Each of the electron beams having been shaped by respective optical systems 100 draws a pattern on the wafer 10. A stage 11 is movable in an XY plane perpendicular to the optical axis of the optical system 100 in a state where an electrostatic chuck (not illustrated) sucks and holds the wafer 10. A detector 12 is mounted on the stage 11. The detector 12 can detect the position of an electron beam and a related current value.

The blanking control circuit 13 can individually control the driving of the plurality of blankers provided in the blanking aperture array 103. A data processing circuit (i.e., a creation unit) 14 can generate (create) stripe data to be supplied to each corresponding optical system 100 and used in the control of each corresponding blanking aperture array 103.

A deflector control circuit 15 can control the deflector 107 of each of the optical systems 100. A detection processing circuit 16 can calculate actual array coordinates and current values of a plurality of electron beams based on a signal from the detector 12. A stage control circuit 17 can control the positioning of the stage 11 with reference to a measurement result with respect to the position of the stage 11 obtained by a laser interferometer (not illustrated).

The intermediate memory 18 is a memory capable of storing one of the pattern data relating to a plurality of types of shot patterns stored in the main memory 22.

A main control system 19 requests the server 21 to supply pattern data corresponding to a shot pattern to be drawn by the drawing apparatus 1. In response to the above-mentioned request, the server 21 transfers the pattern data to the intermediate memory 18. Further, the main control system 19 can control the blanking control circuit 13, the data processing circuit 14, the deflector control circuit 15, the detection processing circuit 16, and the stage control circuit 17 in an integrated manner.

In the present exemplary embodiment, a control unit of the drawing apparatus 1 is constituted by the blanking control circuit 13, the data processing circuit 14, the deflector control circuit 15, the detection processing circuit 16, the stage control circuit 17, and the main control system 19. However, the control unit of the drawing apparatus 1 is changeable appropriately.

Figure 4A:
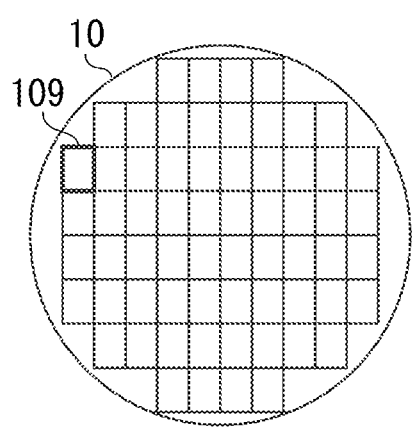
FIGS. 4A and 4B illustrate drawing regions.
Figure 4B:
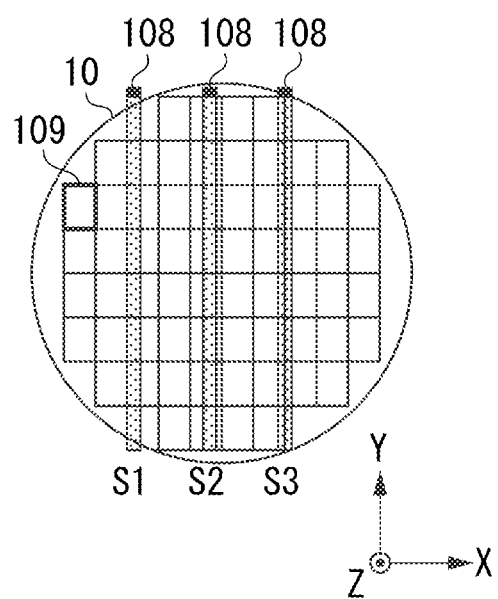

FIGS. 4A and 4B are illustrations relating to the formation of a plurality of drawing regions. FIG. 4A illustrates an arrangement example of a shot region 109 to be drawn on the wafer 10 or an arrangement example of an already formed shot region 109. FIG. 4B illustrates a relationship between three drawing regions 108, which have been formed with electron beams arrayed in an X-axis direction, and the wafer 10.

The drawing apparatus 1 repeats an operation to draw patterns on the wafer 10 in such a way as to form three stripe regions (stripe-shaped regions) S1, S2, and S3 by using respective optical systems 100. When the stage 11 on which the wafer 10 is mounted moves in a Y-axis direction (i.e., a direction perpendicular to the X-axis direction), the drawing regions 108 of three optical systems 100 can perform scanning on the wafer 10.

The drawing apparatus 1 controls irradiation (ON) and/or non-irradiation (OFF) of the electron beams based on the stripe data corresponding to respective stripe regions during a single scanning in the Y-axis direction so that patterns can be drawn simultaneously in three stripe regions. Further, in a case where the drawing apparatus 1 draws neighboring stripe regions, the drawing apparatus 1 performs drawing processing while partly overlapping the stripe regions. In this case, the drawing apparatus 1 sets the moving amount of the stage 11 in the X-axis direction during a single shift operation to be shorter than the width of the stripe region.

FIGS. 5A, 5B, and 5C illustrate a drawing method accompanied by a gradation control. FIG. 5A illustrates an arrangement of electron beams that cooperatively constitute the drawing region 108. The electron beams split by the blanking aperture array 103 constitute a matrix of 5 rows and 20 columns. The pitch according to which five rows are arrayed is two times the pitch according to which twenty columns are arranged.

If the stage 11 moves from top to bottom in the vertical direction as illustrated in FIG. 5A, each optical system 100 successively performs a scanning operation with electron beams arranged in j, k, l, m, and n rows of a target column at respective positions on the wafer 10.

FIG. 5B illustrates a relationship between exposure amount level and positions (1) to (6) on the wafer 10. For example, the optical system 100 irradiates the position (1) at the exposure amount level 5 by using the electron beams of j, k, l, m, and n rows. The optical system 100 irradiates the wafer 10 with all electron beams based on a clock signal. The stage 11 continuously moves at a speed corresponding to the column pitch per clock.

FIG. 5C is a timetable illustrating ON/OFF signals having been set based on the data illustrated in FIG. 5B. More specifically, the timetable illustrates ON/OFF signals of the electron beams belonging to respective rows (j to n rows) that expose the positions (1) to (6) of the wafer 10 arranged in the moving direction of the stage 11. The stage 11 moves by an amount corresponding to one pitch in response to two unit clocks.

The width of the column of electron beams is equivalent to the drawing width of the optical system 100 and corresponds to the width of the stripe region. For example, in a case where 4000 beams per column are disposed at pitches of several tens nm, the width of the stripe region is approximately 80 µm to 100 µm.

Subsequently, pattern data conversion processing that can be performed by the lithography system 1000 and a related drawing method will be described in detail below.

FIG. 6 is a flowchart illustrating creation processes of stripe data to be supplied to each optical system 100 and the drawing method of the lithography system 1000 as described in detail below. First, in step S10, the conversion circuit 20 divides shot pattern related graphic design data (i.e., data corresponding to a drawing pattern) in such a way as to match the width of a sub stripe region. Through the above-mentioned processing, the conversion circuit 20 can generate a plurality of data relating to regions each having a width obtainable by dividing the stripe region by an integer value in a drawing width direction (i.e., the X-axis direction illustrated in FIG. 4). Then, in step S20, the conversion circuit 20 allocates an index (i.e., information relating to continuity of drawing instruction data) to the generated data, for each graphic data.

Figure 7:
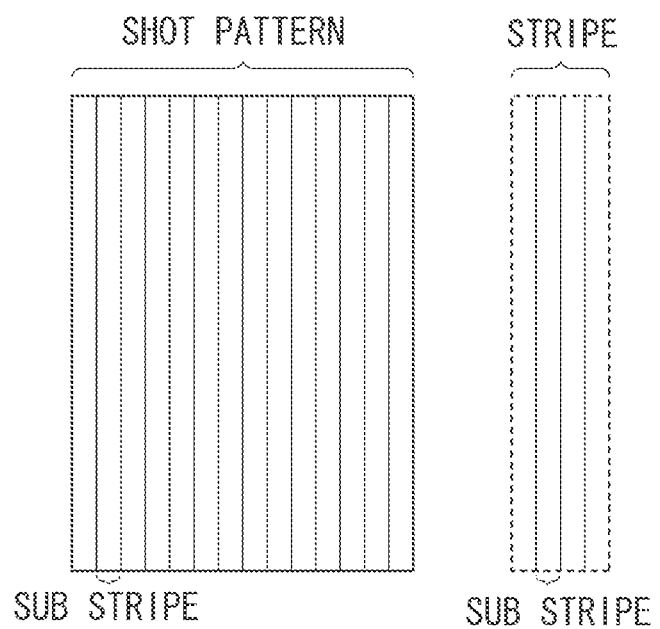
FIG. 7 illustrates data division.

FIG. 7 illustrates a relationship among a shot region corresponding to pattern data, a sub stripe region corresponding to sub stripe data, and a stripe region corresponding to stripe data.

As illustrated in FIG. 7, each sub stripe region is a region obtainable by dividing the stripe data by an integer value and is a region obtainable by dividing the shot region by an integer value. The conversion circuit 20 divides the graphic design data in such a manner that the width (e.g., 5 µm to 10 µm) of the sub stripe region becomes equivalent to a width obtainable by dividing the stripe region (e.g., 80 µm to 100 µm) by an integer value. The conversion circuit 20 determines the width of the sub stripe region based on a deflection width obtainable by the deflector 107, the width of the stripe region (i.e., the width of the drawing region 108), and the width of the shot region. Fine adjustment of the irradiation position can be performed by the deflector 107.

Dividing the data beforehand as mentioned above is useful because stripe data suitable for each optical system 100 can be easily created by simply changing a combination of sub stripe data to be selected. More specifically, it is feasible to complete processing for converting vector formatted graphic design data into bitmap formatted image data including exposure amount information (i.e., the processing requiring the longest processing time) at once. The plurality of optical systems 100 can use common data (can commonly use the data).

Figure 8:
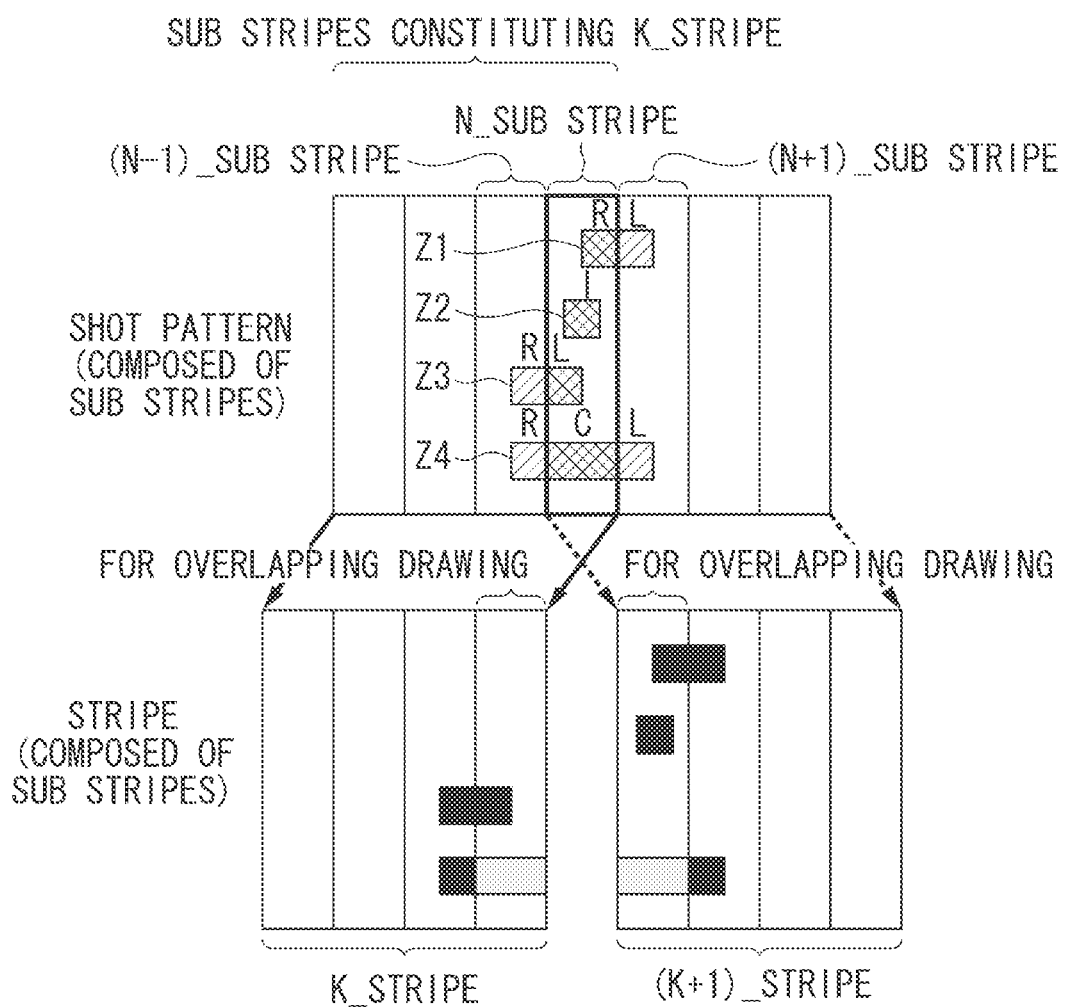
FIG. 8 illustrates index settings.

Next, the processing for allocating an index to graphic data will be described in detail below with reference to FIG. 8. An upper part of FIG. 8 illustrates a layout of patterns represented by graphic design data, which is a layout of patterns to be drawn on the wafer 10. A lower part of FIG. 8 illustrates the belonging of data in sub stripe regions to be drawn in an overlapping fashion, and includes a K_stripe (i.e., a K-th stripe region) and a (K+1)_stripe (i.e., a (K+1)th stripe region). In FIG. 8, an N_sub stripe (i.e., an N-th sub stripe) belongs to each of the K_stripe and the (K+1)_stripe. In other words, the N_sub stripe is an overlapping drawing region (i.e., a region to be drawn in an overlapping fashion).

The N_sub stripe includes four graphic data Z1 to Z4. Each graphic data is data to be converted into drawing instruction data (i.e., data instructing irradiation of an electron beam). Each graphic data is data corresponding to a block of continuous patterns, which is a part of a plurality of patterns to be drawn and included in graphic design data. More specifically, to prevent a pattern from being split in a drawing operation, it is necessary to adjust drawing data relating to graphic data.

In step S20, the conversion circuit 20 divides the graphic data Z1 to Z4 into minute-graphic patterns (which can be referred to as entities or pattern elements) in each sub stripe region to which the data belong. More specifically, the conversion circuit 20 divides the graphic data Z1 into two minute-graphic patterns. The conversion circuit 20 divides the graphic data Z3 into two minute-graphic patterns. The conversion circuit 20 divides the graphic data Z4 into three minute-graphic patterns. Mesh regions indicate four minute-graphic patterns positioned in the N_sub stripe.

The conversion circuit 20 allocates an index to each minute-graphic pattern in the following four cases (a) to (d). The index is information indicating the presence of continuity between a minute-graphic pattern included in the data relating to a sub stripe region (i.e., drawing instruction data in first sub pattern data) and a minute-graphic pattern included in the data relating to a neighboring sub stripe region (i.e., drawing instruction data in second sub pattern data). Further, in allocating the index, information identifying sub stripe data to which a minute-graphic pattern of interest is continuous (e.g., the number of sub patterns) is included.

(a) The conversion circuit 20 allocates an index "R" if there is a minute-graphic pattern that is continuous only to a right-hand sub stripe region.
(b) The conversion circuit 20 allocates an index "L" if there is a minute-graphic pattern that is continuous only to a left-hand sub stripe region.
(c) The conversion circuit 20 allocates an index "C" if there is a minute-graphic pattern that is continuous to both of right-hand and left-hand sub stripe regions.
(d) The conversion circuit 20 allocates an index "I" if there is not any minute-graphic pattern that is continuous to a right-hand region or a left-hand sub stripe region.

For example, the conversion circuit 20 allocates the index "R" to the graphic data Z1 belonging to the N_sub stripe and allocates the index "L" to the graphic data Z1 belonging to an (N+1)_sub stripe. Similarly, the conversion circuit 20 allocates the index "I" to the graphic data Z2 and allocates the index "C" to the graphic data Z4 belonging to the N_sub stripe.

As mentioned above, the conversion circuit 20 divides the graphic design data into a plurality of sub stripes and divides the graphic data into minute-graphic data according to the belonging to each sub stripe. Further, the conversion circuit 20 obtains data converted in such a way as to include information about the position of each minute-graphic pattern and the shape indicated by the minute-graphic pattern, and an index allocated to each minute-graphic pattern.

Referring back to FIG. 6, the conversion circuit obtains compressed data of the sub stripes converted into bitmap formatted data including the index and transfers the sub stripe data to the server 21. In step S30, the server 21 causes the main memory 22 to store the converted pattern data. Similarly, the conversion circuit 20 converts other shot pattern related graphic design data into pattern data. The server 21 causes the main memory 22 to store a plurality of types of pattern data.

If the shot pattern to be drawn by the drawing apparatus 1 is determined, then in step S30, the main control system 19 of the drawing apparatus 1 requests the server 21 to transfer pattern data relating to the determined shot pattern. The server 21 selects the requested pattern data from the plurality of types of pattern data stored in the main memory 22. Then, in step S40, the server 21 transfers the selected pattern data to the intermediate memory 18 of the drawing apparatus 1 (i.e., the request source).

The data processing circuit 14 successively converts a plurality of sub stripe data into stripe data to be used by the optical system 100. To this end, the main control system 19 of the drawing apparatus 1 selects and extracts a part of the pattern data transferred to the intermediate memory 19 and determines a selection condition to distribute the sub stripe data required in each optical system 100.

The selection condition indicates the number of sub stripe data while regarding an edge position of the drawing region 108 of each optical system 100 as a start point. The edge position of the drawing region 108 can be determined based on a relative positional relationship between layout information about the shot region and the optical system 100. The number of sub stripe data to be selected can be determined based on the drawing width of the drawing region 108 in the drawing width direction (i.e., the above-mentioned X-axis direction). To improve the continuity of patterns to be drawn, the main control system 19 designates both ends of sub stripe data to be selected as sub stripe data dedicated to the overlapping drawing.

The main control system 19 instructs the data processing circuit 14 to select a plurality of sub stripe data to be processed by the data processing circuit 14. In step S50, the data processing circuit 14 selects a plurality of sub stripe data to be used by the optical system 100 (i.e., the connecting destination) of each of the data processing circuits 14 according to the above-mentioned selection condition. Further, the data processing circuit 14 changes the exposure amount information about the selected sub stripe data based on the allocated index in such a way as to obtain sub stripe data dedicated to the overlapping drawing.

The lower part of FIG. 8 illustrates the K_stripe and the (K+1)_stripe in a state where the exposure amount information has been changed based on the index. The changed result illustrated in FIG. 8 is based on the following conditions (a) to (d).
(a) The main control system 19 performs deletion processing in such a way as to cause the minute-graphic pattern to which the index "R" has been allocated to belong to the (K+1)_stripe.
(b) The main control system 19 performs deletion processing in such a way as to cause the minute-graphic pattern to which the index "I" has been allocated to belong to the (K+1)_stripe.
(c) The main control system 19 causes the minute-graphic pattern to which the index "L" has been allocated to belong to the K_stripe.
(d) The main control system 19 causes the minute-graphic pattern to which the index "C" has been allocated to belong to the K_stripe while adding information to halve the exposure amount.

The main control system 19 performs an operation to reduce the exposure amount, for example, deletes a minute-graphic pattern in a predetermined sub stripe data or halves the exposure amount of a minute-graphic pattern, based on the index. Determining the belonging destination becomes important, especially, in a case where the sub stripe data corresponding to an overlapping drawing region includes a minute-graphic pattern continuous to sub stripe data corresponding to a non-overlapping drawing region. In such a case, to prevent a pattern straddling a border between two stripe regions drawn at different timings from being split, it is desired to cause the minute-graphic pattern to belong to a stripe to which the sub stripe data corresponding to the non-non-overlapping drawing region is supplied.

The stripe data generation processing (to be performed in step S60) will be described in detail below with reference to a schematic view illustrated in FIG. 9. The data processing circuit 14 includes memories 14*b* and 14*d* and data processing circuits 14*a* and 14*c*.

The data processing circuit 14*a* of the data processing circuit 14 selects and reads a plurality of sub stripe data according to the above-mentioned selection condition, sets a part of the selected sub stripe data as sub stripe data dedicated to the overlapping drawing, and changes the exposure amount information. Then, the data processing circuit 14*a* causes the memory 14*b* to store information about the above-mentioned sub stripe data temporarily. The data processing circuit 14*c* develops the plurality of sub stripe data that constitute stripe data and performs correction processing (e.g., aberration correction) peculiar to each of the optical systems 100. The data processing circuit 14*c* causes the memory 14*d* to store the generated stripe data. The memory 14*d* is a two-sided buffer memory that can store two stripe data.

Referring back to FIG. 6, the blanking control circuit 13 creates irradiation control data to control the blanking aperture array 103 based on the generated stripe data (i.e., the changed data). In step S70, the main control unit 19 draws a pattern on the wafer 10 based on the irradiation data created by the blanking control circuit 13.

The main control unit 19 causes the blanking control circuit 13 to control the blanking aperture array 103 and causes the stage control circuit 17 to control the movement of the stage 11. The main control unit 19 causes the drawing apparatus to perform drawing processing based on one stripe data piece, which is a part of the data stored in the buffer memory 14*d* of each optical system 100.

If the drawing apparatus terminates a drawing operation for one stripe region, the main control system 19 reads the next stripe data from the other memory of the two-sided buffer memory 14*d*. The main control system 19 causes the drawing apparatus to draw the next stripe region based on the readout stripe data. While performing the drawing operation of the second stripe region, the data control circuit 14*a* further selects stripe data to be drawn next according to a method similar to the above-mentioned method. The data processing circuit 14*c* develops stripe data constituted by compressed sub stripe data and overwrites the one memory of the buffer memory 14d, which stores the stripe data having been already subjected to the drawing operation, with the developed data.

The main control system 19 successively selects sub stripe data required for the optical system 100, develops the selected sub stripe data, and causes the memory 14d to store the developed sub stripe data. Successively generating stripe data is useful because it is unnecessary to store pattern data corresponding to one-shot pattern for each of the optical systems 100. Therefore, it becomes feasible to prevent the package size from increasing and reduce the costs.

As mentioned above, in the lithography system according to the present exemplary embodiment, the main memory 22 stores various pattern data that are divided into multiple sub stripe data. Each of the drawing apparatuses 1 can generate stripe data necessary for each of the optical systems 100 by selecting and combining a plurality of sub stripe data. Therefore, different optical systems can commonly use the same pattern data.

Further, the lithography system allocates an index indicating information relating to the continuity of graphic data to each sub stripe data piece. The lithography system determines the target optical system 100 to be used to draw a pattern relating to an overlapping drawing region based on the index and changes the exposure amount of a minute-graphic pattern included in the overlapping drawing region according to a belonging destination. For example, the lithography system deletes a pattern (namely, sets the exposure amount of the pattern to zero) if drawing the pattern is unnecessary or cancelled. Alternatively, the lithography system reduces the exposure amount for the overlapping drawing. As mentioned above, constituting each pattern data piece by a plurality of sub stripe data each having an index allocated uniquely is useful not only to enable a plurality of optical systems to commonly use the data but also to realize an overlapping drawing.

It is desired that the relative positional relationship between the optical systems 100 or the relative positional relationship between the drawing regions 108 formed by electron beams is not a position derived from design values, but a position based on actually measured values. Even when mechanical machining accuracy and assembling accuracy of each of the drawing apparatuses 1 cause device differences in the relative distance between the optical systems 100, the lithography system can set a new selection condition in such a way as to eliminate the device differences and can perform drawing processing by using common pattern data.

Further, it is desired to update the selection condition based on actually measured values of the positions of respective optical systems 100 or positions of the drawing regions formed by electron beams. Even in a case where the relative positional relationship between the optical systems 100 varies with time elapsed due to vibrations occurring in the drawing operation, the lithography system can perform drawing processing by using the common pattern data. Because no time is required to reconstruct pattern data, the lithography system brings an effect of preventing the throughput of the substrate processing from deteriorating in such a way as to solve the problem caused by positional deviation of the optical system occurring with time elapsed.

The belonging destination of the graphic data to which the index "I" is allocated can be the (K+1)_stripe or the K_stripe.

Other Exemplary Embodiment

In the above-mentioned exemplary embodiment, the lithography system performs the overlapping drawing in only one sub stripe region. However, the number of sub stripe regions to be subjected to the overlapping drawing is not limited to the above-mentioned example. Further, in a case where the number of sub stripe data to be subjected to the overlapping drawing is large, the indices to be used are not limited to the above-mentioned four types. Any other index including information usable to identify a continuous sub stripe data is usable.

In the above-mentioned exemplary embodiment, the data processing circuit 14 reads a plurality of sub stripe data and changes the exposure amount information based on the index, and further generates stripe data. However, the drawing apparatus 1 can include a plurality of circuits to perform the above-mentioned three processes independently.

The blanking aperture array 103 can be replaced by any other device that is capable of controlling irradiation and/or non-irradiation of a plurality of electron beams based on drawing pattern related data and controlling the exposure amount at a predetermined position.

It is feasible to use common pattern data even in a case where the drawing width is differentiated for each optical system. Further, the number of optical systems and the number of beams supplied by each optical system are not limited to the values described in the above-mentioned exemplary embodiment and can be appropriately changed. The drawing apparatuses provided in the lithography system is not limited to a specific number. However, in a case where the lithography system includes only one drawing apparatus, the drawing apparatus needs to include functions of the conversion circuit 20 and the main memory 22. For example, the main control system 19 can be configured to include functions of the conversion circuit 20 and the main memory 22. On the other hand, in a case where the lithography system includes a plurality of drawing apparatuses, the lithography system can cause each drawing apparatus to draw the same pattern or cause respective drawing apparatuses to draws different patterns.

The above-mentioned exemplary embodiments have been described with reference to the drawing apparatuses that can draw patterns with electron beams. However, the drawing apparatus applicable to the lithography system according to the present disclosure is not limited to the above-mentioned examples. For example, the drawing apparatus can be configured to draw a pattern on a substrate with charged particle beam (e.g., ion beam), KrF excimer laser beam, ArF excimer laser beam, or EUV light.

[Method of Manufacturing Articles]

A method of manufacturing articles (e.g., a semiconductor integrated circuit element, a liquid crystal element, an image sensor, a magnetic head, a CD-RW, an optical element, or a photomask) according to an exemplary embodiment of the present disclosure includes a process of drawing a pattern on a substrate (e.g., a wafer or a glass plate) with the above-mentioned drawing apparatus and a process of developing the drawn substrate. Further, the method of manufacturing articles can include other conventionally known processing processes (e.g., oxidation, film formation, evaporation, flattening, etching, resist stripping, dicing, bonding, and packaging).

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-218719, filed Oct. 27, 2014, which is hereby incorporated by reference herein in its entirety.

What is claimed is:

1. A drawing apparatus that includes a plurality of optical systems and repeats an operation to draw a pattern on a substrate while partly overlapping stripe-shaped regions drawn by the optical systems, comprising a creation unit configured to create data to be supplied to each of the plurality of optical systems by using a plurality of sub pattern data, each of the plurality of sub pattern data serving as unit data of pattern data used by the plurality of optical systems, corresponding to a region having a width obtainable by dividing the stripe-shaped regions in a drawing width direction, and including information relating to continuity of drawing instruction data and exposure amount information, wherein the creation unit is configured to create the data by changing exposure amount information corresponding to an overlapping drawing region based on the information relating to the continuity.

2. The drawing apparatus according to claim 1, wherein the plurality of sub pattern data includes first sub pattern data and second sub pattern data neighboring the first sub pattern data, and the information relating to the continuity includes the presence of continuity between the drawing instruction data in the first sub pattern data and the drawing instruction data in the second sub pattern data.

3. The drawing apparatus according to claim 2, wherein the information relating to the continuity includes the number of sub pattern data that the drawing instruction data in the first sub pattern data is continuously belonging to.

4. The drawing apparatus according to claim 2, wherein the first sub pattern data is sub pattern data corresponding to the overlapping drawing region and the second sub pattern data is sub pattern data corresponding to a non-overlapping drawing region, and wherein the creation unit is configured to change the exposure amount information indicated by the drawing instruction data, in a case where the first sub pattern data includes the drawing instruction data that is continuous to the first sub pattern data and the second sub pattern data.

5. The drawing apparatus according to claim 2, wherein the creation unit is configured to change the exposure amount information in such a way as to reduce an exposure amount indicated by the exposure amount information based on the information relating to the continuity.

6. The drawing apparatus according to claim 1, wherein the creation unit is configured to change the exposure amount information indicated by the drawing instruction data by deleting the drawing instruction data.

7. A lithography system comprising:

a plurality of drawing apparatuses each including a plurality of optical systems and repeating an operation to draw a pattern on a substrate while partly overlapping stripe-shaped regions drawn by the optical systems, and a storage unit configured to store pattern data used by the plurality of optical systems, wherein each pattern data piece is constituted by a plurality of sub pattern data each corresponding to a region having a width obtainable by dividing the stripe-shaped regions in a drawing width direction and including information relating to continuity of drawing instruction data, wherein each of the plurality of the drawing apparatuses includes a creation unit configured to select a combination of sub pattern data from the plurality of sub pattern data, change exposure amount information of sub pattern data serving as an overlapping drawing region based on the information relating to the continuity, and create data to be supplied to each of the plurality of the optical systems.

8. A method for creating pattern data to be supplied to a plurality of optical systems, the pattern data creation method comprising:

dividing data corresponding to a drawing pattern and generating a plurality of data each corresponding to a region having a width obtainable by dividing a drawing width of one optical system of the plurality of optical systems, allocating information relating to continuity of drawing instruction data to the data, and changing exposure amount information in data corresponding to an overlapping drawing region based on the information relating to the continuity.

9. A drawing method for repeating an operation to draw a pattern on a substrate with a plurality of optical systems while partly overlapping stripe-shaped regions drawn by the respective optical systems, the drawing method comprising:

acquiring a plurality of sub pattern data that cooperatively constitute pattern data used by the plurality of optical systems, wherein the sub pattern data corresponds to a region obtainable by dividing a width of one stripe-shaped region and includes information relating to continuity of drawing instruction data;

changing exposure amount information in sub pattern data corresponding to an overlapping drawing region based on the information relating to the continuity allocated to the sub pattern data corresponding to the overlapping drawing region; and drawing a pattern on the substrate based on the changed data.

10. A method of manufacturing articles comprising:

performing a drawing operation on a substrate with a drawing apparatus that includes a plurality of optical systems and repeats an operation to draw a pattern on the substrate while partly overlapping stripe-shaped regions drawn by the optical systems; and developing the drawn substrate, wherein the drawing apparatus comprises:

a creation unit configured to create data to be supplied to each of the plurality of optical systems by using a plurality of sub pattern data, each of the plurality of sub pattern data serving as unit data of pattern data used by the plurality of optical systems, corresponding to a region having a width obtainable by dividing the stripe-shaped regions in a drawing width direction, and including information relating to continuity of drawing instruction data and exposure amount information, and wherein the creation unit is configured to create the data by changing exposure amount information corresponding to an overlapping drawing region based on the information relating to the continuity.

* * * * *